United States Patent [19]

Yamazaki et al.

[11] Patent Number: 5,700,333
[45] Date of Patent: Dec. 23, 1997

[54] THIN-FILM PHOTOELECTRIC CONVERSION DEVICE AND A METHOD OF MANUFACTURING THE SAME

[75] Inventors: Shunpei Yamazaki, Tokyo; Yasuyuki Arai, Kanagawa, both of Japan

[73] Assignee: Semiconductor Energy Laboratory Co., Ltd., Kanagawa-ken, Japan

[21] Appl. No.: 623,336

[22] Filed: Mar. 27, 1996

[30] Foreign Application Priority Data

| Mar. 27, 1995 | [JP] | Japan | 7-129864 |
| Mar. 27, 1995 | [JP] | Japan | 7-129865 |
| Apr. 11, 1995 | [JP] | Japan | 7-110121 |

[51] Int. Cl.$^6$ ............ H01L 31/04; H01L 31/0368; H01L 31/18
[52] U.S. Cl. ............ 136/258; 136/261; 257/49; 257/75; 437/4; 437/10; 437/11; 437/12; 437/109; 437/247; 437/967
[58] Field of Search ............ 437/4, 10–13, 437/109, 247, 967; 136/258 PC, 261; 257/49, 75

[56] References Cited

U.S. PATENT DOCUMENTS

| 4,561,171 | 12/1985 | Schlosser | 437/10 |
| 5,085,711 | 2/1992 | Iwamoto et al. | 136/258 |
| 5,244,819 | 9/1993 | Jue | 437/11 |
| 5,275,851 | 1/1994 | Fonash et al. | 427/578 |
| 5,380,372 | 1/1995 | Campe et al. | 136/258 |
| 5,426,061 | 6/1995 | Sopori | 437/11 |

FOREIGN PATENT DOCUMENTS

| 3049226 | 3/1982 | Germany | 136/258 PC |
| 5-109737 | 4/1993 | Japan | |

*Primary Examiner*—Aaron Weisstuch
*Attorney, Agent, or Firm*—Fish & Richardson, P.C.

[57] ABSTRACT

A method of manufacturing a thin-film solar cell, comprising the steps of: forming an amorphous silicon film on a substrate; placing a metal element that accelerates the crystallization of silicon in contact with the surface of the amorphous silicon film; subjecting the amorphous silicon film to a heat treatment to obtain a crystalline silicon film; depositing a silicon film to which phosphorus has been added in contact with the crystalline silicon film; and subjecting the crystalline silicon film and the silicon film to which phosphorus has been added to a heat treatment to getter the metal element from the crystalline film.

31 Claims, 3 Drawing Sheets

THIN-FILM PHOTOELECTRIC CONVERSION DEVICE AND A METHOD OF MANUFACTURING THE SAME

BACKGROUND OF THE INVENTION

1. Field of the Invention

The present invention relates to a thin-film photoelectric conversion device, especially a solar cell which is formed on a substrate, and more particularly to a thin-film solar cell having a photoelectric conversion layer formed of a crystalline silicon film.

2. Description of the Related Art

A solar cell or a solar battery can be manufactured using a variety of semiconductor materials or organic compound materials. However, from an industrial viewpoint, silicon is mainly used for the solar cell. The solar cells using silicon can be classified into a bulk solar cell using a wafer of monocrystal silicon or polycrystal silicon and a thin-film solar cell having a silicon film formed on a substrate. Reduction of manufacturing costs is required, and the thin-film solar cell is expected to have the effect of reducing the costs because less raw materials are used for the thin-film solar cell than for the bulk solar cell.

In the field of thin-film solar cells, an amorphous silicon solar cell has been placed into practical use. However, since the amorphous silicon solar cell is lower in conversion efficiency compared with the monocrystal silicon or polycrystal silicon solar cell and also suffers from problems such as deterioration due to light exposure and so on, the use thereof is limited. For that reason, as another means, a thin-film solar cell using a crystalline silicon film has been also developed.

A melt recrystallization method and a solid-phase growth method are used for obtaining a crystalline silicon film in the thin-film solar cell. In both the methods an amorphous silicon layer is formed on a substrate and recrystallized, thereby obtaining a crystalline silicon film. In any event, the substrate is required to withstand the crystallization temperature, whereby usable materials are limited. In particular, in the melt recrystallization method, the substrate has been limited to a material that withstands 1,412° C., which is the melting point of silicon.

The solid-phase growth method is a method in which an amorphous silicon film is formed on the substrate and crystallized thereafter through a heat treatment. In such a solid-phase growth method, in general, as the temperature becomes high, the processing time may be shortened more. However, the amorphous silicon film is hardly crystallized at a temperature of 500° C. or lower. For example, when the amorphous silicon film which has been grown through a gas-phase growth method is heated at 600° C. so as to be crystallized, 10 hours are required. Also, when the heat treatment is conducted at the temperature of 550° C., 100 hours or longer is required for the heat treatment.

For the above reason, a high heat resistance has been required for the substrate of the thin-film solar cell. Therefore, glass, carbon, or ceramic was used for the substrate. However, from the viewpoint of reducing the costs of the solar cell, those substrates are not always proper, and it has been desired that the solar cell be fabricated on a substrate which is most generally used and inexpensive. However, for example, the #7059 glass substrate made by Corning, which is generally used, has a strain point of 593° C., and the conventional crystallization technique allows the substrate to be strained and largely deformed. For that reason, such a substrate could not be used. Also, since a substrate made of a material essentially different from silicon is used, monocrystal cannot be obtained even through crystallization is conducted on the amorphous silicon film through the above means, and silicon having large crystal grains is hard to obtain. Consequently, this causes a limit to an improvement in the efficiency of the solar cell.

In order to solve the above problems, a method of crystallizing an amorphous silicon film through a heat treatment is disclosed in U.S. Pat. No. 5,403,772. According to the method disclosed in this patent, in order to accelerate crystallization at a low temperature, a small amount of a metal element is added to the amorphous silicon film as a catalyst material. Further, it is therein disclosed that a lowering of the heat treatment temperature and a reduction of the treatment time are enabled. Also, it is disclosed therein that a simple elemental metal substance, e.g. nickel (Ni), iron (Fe), cobalt (Co), or platinum (Pt), or a compound of any one of those metals and silicon, or the like is suitable for the catalyst material.

However, since the catalyst materials used for accelerating crystallization are naturally undesirable for crystalline silicon, it has been desired that the concentration of the catalyst material is as low as possible. The concentration of catalyst material necessary for accelerating crystallization was $1 \times 10^{17}/cm^3$ to $1 \times 10^{20}/cm^3$. However, even when the concentration is relatively low, since the above catalyst materials are heavy metal elements, the material contained in silicon forms a defect level, thereby lowering the characteristics of a fabricated element.

The principle of operation of a solar cell containing a p-n junction can be roughly described as follows. The solar cell absorbs light and generates electron/hole charge pairs due to absorbed light energy. The electrons move toward the n-layer side of the junction, and the holes move toward the p-layer side due to drift caused by the junction electric field and diffusion. However, when the defect levels are high in silicon, the charges are trapped by the defect levels while they are moving in the silicon, thereby disappearing. In other words, the photoelectric conversion characteristics are lowered. The period of time from when the electrons/holes are generated until they disappear is called the "life time". In the solar cell, it is desirable that the lifetime is long. Hence, it has been necessary to reduce as much as possible the heavy metal elements that generate the defect levels in silicon.

SUMMARY OF THE INVENTION

The present invention has been made in view of the above circumstances, and therefore an object of the present invention is to provide a method of manufacturing a thin-film solar cell, which retains the feature of crystallization due to the above catalyst material and removes the catalyst material after the crystallization has been completed.

Another object of the present invention is to provide a solar cell which has an excellent photoelectric conversion characteristic, using the above method.

In accordance with the primary feature of the present invention, a method of manufacturing a photoelectric conversion device includes a step of forming a gettering layer on a crystallized semiconductor layer obtained by using a catalyst metal such as nickel. The gettering layer may be either insulative or semiconductive and contains phosphorus to absorb the catalyst metal such as nickel from the semiconductor layer after it is crystallized, thereby reducing the concentration of the catalyst metal in the semiconductor layer. Specifically, the method includes the steps of:

disposing a metal containing layer in contact with an upper or lower surface of a non-single crystalline silicon semiconductor layer;

crystallizing the non-single crystalline silicon semiconductor layer by heating, wherein the metal functions to promote the crystallization;

forming a gettering layer on or within said semiconductor layer after crystallized, the gettering layer containing phosphorus; and heating said semiconductor layer and the gettering layer in order to getter the metal contained in the semiconductor layer.

As the metal element, it is possible to use one or more elements chosen from Ni, Fe, Co, Ru, Rh, Pd, Os, Ir, Pt, Cu, and Au.

In accordance with a preferred embodiment of the invention, the gettering layer may be a silicon layer to which phosphorus is added during the deposition thereof onto the crystallized semiconductor layer. In an alternative, the gettering layer may be a phosphorus doped region formed within the crystallized semiconductor layer, namely, a method of the present invention includes a step of introducing phosphorus ions into a surface region of the crystallized semiconductor layer by ion doping after crystallizing the semiconductor layer by the use of the catalyst metal. In a further alternative, the gettering layer may be a phosphosilicate glass (PSG) layer deposited on the crystallized semiconductor layer.

In accordance with another aspect of the invention, the catalyst metal is provided by disposing the metal containing layer in contact with an upper or lower surface of a non-single crystalline semiconductor layer to be crystallized. In the case of disposing the metal containing layer under the non-single crystalline semiconductor layer, the metal containing layer may be used also as a lower electrode of the photoelectric conversion device.

In accordance with still another aspect of the invention, a solar cell comprises a substrate, a first crystalline silicon film having conductivity type formed on the substrate, and a second crystalline silicon film having another conductivity type adjacent to the first crystalline silicon film, wherein the first crystalline silicon film contains a catalyst element for promoting crystallization of silicon at a concentration not higher than $5 \times 10^{18}$ atoms/cm$^3$. The concentration value disclosed in the present invention is determined by secondary ion mass spectroscopy and corresponds to a maximum value of the measured values.

In accordance with a further aspect of the invention, in the above mentioned solar cell, the concentration of the catalyst contained in the second crystalline silicon film is higher than the concentration of the catalyst contained in the first crystalline silicon film.

In accordance with a still further aspect of the invention, the crystalline semiconductor film obtained by using the catalyst metal such as nickel has a plurality of crystal grains in the form of needles.

According to the present invention, the lifetime of carriers in the crystalline silicon film is increased, and the excellent characteristics of the thin-film solar cell are obtained.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Now, a description will be given in more detail of embodiments of the present invention with reference to the accompanying drawings.

First Embodiment

The first embodiment shows a process of manufacturing a thin-film solar cell through a method of forming an amorphous silicon film in close contact with a metal element that accelerates the crystallization of silicon, crystallizing said amorphous silicon film through a heat treatment, and removing said metal element remaining in the amorphous silicon film after the crystallization.

Figure 1A:
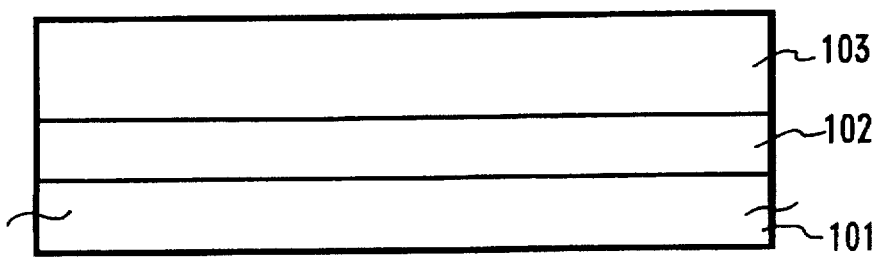
FIGS. 1A to 1D are schematic diagrams showing a method of manufacturing a thin-film solar cell in accordance with the present invention.

This embodiment will be described with reference to FIGS. 1A to 1D. In this embodiment, nickel is used as a metal element having a catalyst action that accelerates the crystallization of silicon. First, a silicon oxide film 102 having a thickness of 0.3 μm is formed on a glass substrate (for example, Corning 7059 glass substrate) 101 as an underlying layer. The silicon oxide film 102 is formed through a plasma CVD technique using tetra ethoxy silane (TEOS as a raw material), and also can be formed through a sputtering technique as another method. Subsequently, an amorphous silicon film 103 is formed using silane gas as a raw material through a plasma CVD technique. The formation of the amorphous silicon film 103 may be conducted using a low pressure thermal CVD technique, a sputtering technique, or an evaporation method. The above amorphous silicon film 103 may be a substantially-intrinsic amorphous silicon film or may contain boron (B) at 0.001 to 0.1 atms %. Also, the thickness of the amorphous silicon film 103 is set at 10 μm. However, the thickness may be set at a required value (FIG. 1A).

Subsequently, the substrate is immersed in an ammonium hydroxide, hydrogen peroxide mixture and then held at 70° C. for 5 minutes, to thereby form an oxide film (not shown) on the surface of the amorphous silicon film 103. The silicon oxide film is formed in order to improve wettability in the next step process of coating with a nickel acetate solution. The nickel acetate solution is coated on the surface of the amorphous silicon film 103 by spin coating. The nickel functions as an element that accelerates the crystallization of the amorphous silicon film 103.

Subsequently, the amorphous silicon film 103 is held at a temperature of 450° C. for one hour in a nitrogen atmosphere, thereby eliminating hydrogen from the amorphous silicon film 103. This is because dangling bonds are intentionally produced in the amorphous silicon film, to thereby lower the threshold energy in subsequent crystallizing. Then, the amorphous silicon film 103 is subjected to a heat treatment at 550° C. for 4 to 8 hours in the nitrogen atmosphere, to thereby crystallize the amorphous silicon film 103. The temperature during crystallizing can be set to 550° C. because of the action of the nickel. 0.001 atms % to 5 atms % hydrogen is contained in crystallized silicon film 104. During the above heat treatment, nickel accelerates the crystallization of the silicon film while it is moving in the silicon film.

Figure 1B:
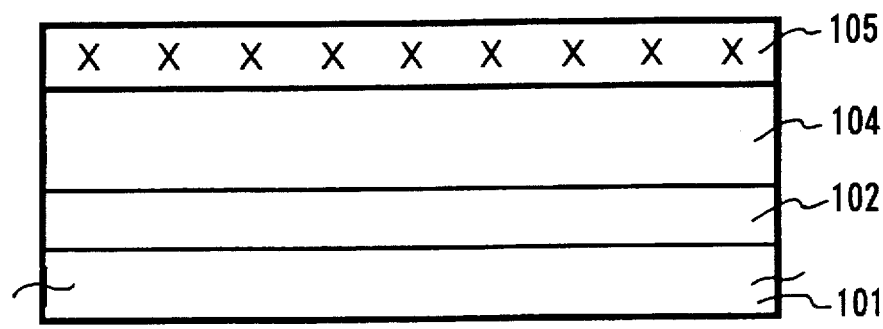

In this way, the crystalline silicon film 104 is formed on the glass substrate. Subsequently, a phospho-silicate glass (PSG) 105 is formed on the crystalline silicon film 104. The phospho-silicate glass (PSG) 105 is formed, using a gas mixture consisting of silane, phosphine, and oxygen, at a temperature of 450° C. through an atmospheric CVD technique. The concentration of phosphorus in the phospho-silicate glass is set to 1 to 30 wt %, preferably 7 wt %. The phospho-silicate glass (PSG) 105 is used to getter nickel remaining in the crystalline silicon film. Even though the phospho-silicate glass 105 is formed at only 450° C., its effect is obtained. More effectively, the phospho-silicate glass 105 may be subjected to a heat treatment at a temperature of 500° to 800° C., preferably 550° C. for 1 to 4 hours in a nitrogen atmosphere. As another method, the phospho-silicate glass 105 can be replaced by a silicon film to which phosphorus of 0.1 to 10 wt % has been added with the same effect (FIG. 1B).

Figure 1C:
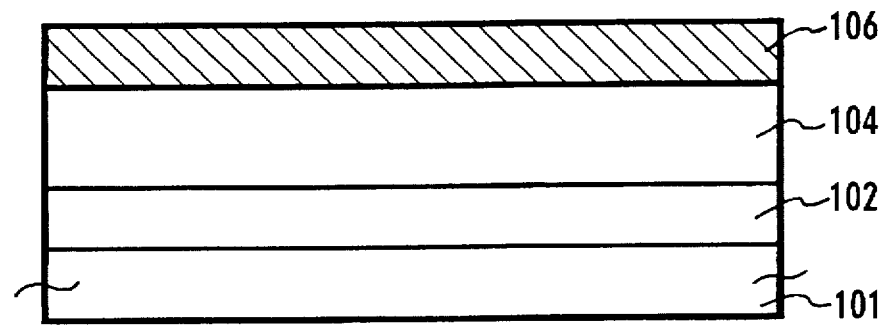

Thereafter, the phospho-silicate glass 105 is etched using an aqueous hydrogen fluoride solution so as to be removed from the surface of the crystalline silicon film 104. As a result, the surface of the crystalline silicon film 104 is exposed. On that surface there is formed an n-type crystalline silicon film 106. The n-type crystalline silicon film 106 may be formed through a plasma CVD technique or through a low pressure thermal CVD technique. The n-type crystalline silicon film 106 is desirably formed at a thickness of 0.02 to 0.2 µm, and in this embodiment, it is formed at a thickness of 0.1 µm (FIG. 1C).

Figure 1D:
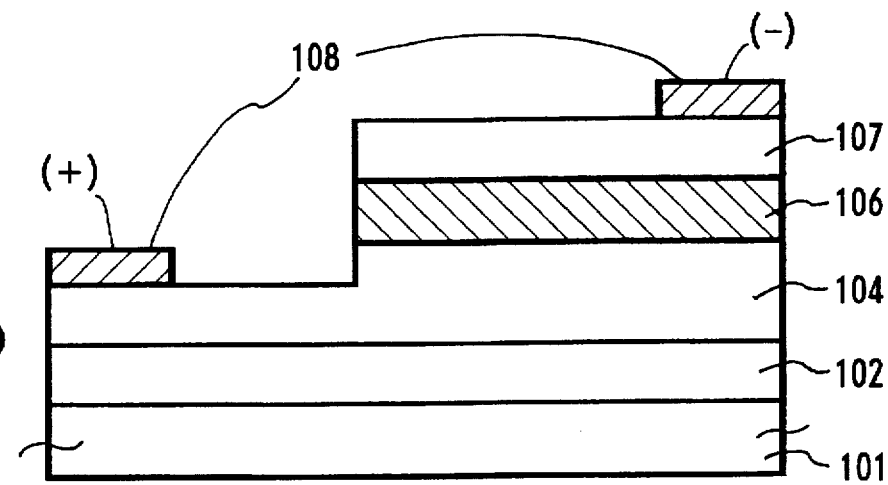

Then, a transparent electrode 107 is formed through a sputtering technique on the above n-type crystalline silicon film 106. The transparent electrode 107 is made of indium tin oxide alloy (ITO) and has a thickness of 0.08 µm. Finally, a process of providing output electrodes 108 is conducted. In providing the output electrodes 108, as shown in FIG. 1D, a negative side electrode is disposed on the transparent electrode 107, and a positive side electrode is disposed on the crystalline silicon film 104 by removing parts of the transparent electrode 107, the n-type crystalline silicon film 106, and the crystalline silicon film 104. The output electrodes 108 can be formed by sputtering or vacuum evaporation, or using an aluminum or silver paste or the like. Furthermore, after the provision of the output electrodes 108, the product is subjected to a heat treatment at 150° C. to 300° C. for several minutes with the result that the adhesion between the output electrodes 108 and the underlying layer becomes high, thereby obtaining an excellent electric characteristic. In this embodiment, the product is subjected to a heat treatment at 200° C. for 30 minutes in a nitrogen atmosphere using an oven.

Through the above-mentioned processes, a thin-film solar cell is completed.

Second Embodiment

In a second embodiment, there is described a thin-film solar cell which is formed in a process where a metal element that accelerates the crystallization of crystalline silicon is removed after crystallization, through a method where phosphorus is implanted into the surface of the crystalline silicon film via a plasma doping method.

Figure 2A:
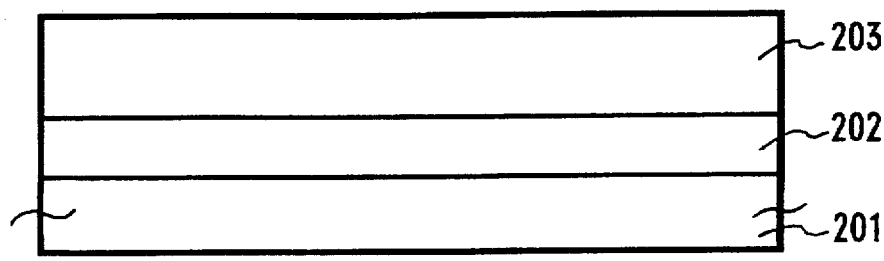
FIGS. 2A to 2D are schematic diagrams showing a method of manufacturing a thin-film solar cell in accordance with the present invention.

The second embodiment will be described with reference to FIGS. 2A to 2D. Nickel is used in this embodiment as a metal element functioning as a catalyst to accelerate the crystallization to accellerate the crystallization of silicon. First, a silicon oxide film 202 having a thickness of 0.3 µm is formed on a glass substrate (for example, Corning 7059 glass substrate) 201 as an underlying layer. The silicon oxide film 202 is formed by plasma CVD with tetra ethoxy silane (TEOS as a raw material), and also can be formed through a sputtering technique as another method. Subsequently, an amorphous silicon film 203 is formed with silane gas as a raw material through a plasma CVD technique. The formation of the amorphous silicon film 203 may be conducted using a low pressure thermal CVD technique, a sputtering technique, or an evaporation method. The above amorphous silicon film 203 may be a substantially-intrinsic amorphous silicon film or an amorphous silicon film to which boron (B) of 0.001 to 0.1 atms % has been added. Also, the thickness of the amorphous silicon film 203 is set at 20 µm. However, the thickness may be set at any required value (FIG. 2A).

Thereafter, the substrate is immersed in an ammonium hydroxide, hydrogen peroxide mixture at 70° C. for 5 minutes, to thereby form an oxide film (not shown) on the surface of the amorphous silicon film 203. The silicon oxide film is formed in order to improve wettability in the next step of coating with a nickel acetate solution. The nickel acetate solution is coated on the surface of the amorphous silicon film 203 by spin coating. The nickel element functions as an element that accelerates the crystallization of the amorphous silicon film 203.

Subsequently, the amorphous silicon film 203 is held at a temperature of 450° C. for one hour in a nitrogen atmosphere, thereby eliminating hydrogen from the amorphous silicon film 203. This is because dangling bonds are intentionally produced in the amorphous silicon film, to thereby lower the threshold energy in subsequent crystallizing. Then, the amorphous silicon film 203 is subjected to a heat treatment at 550° C. for 4 to 8 hours in a nitrogen atmosphere, to thereby crystallize the amorphous silicon film 203. The temperature during crystallizing can be set to 550° C. because of the action of the nickel. 0.001 atms % to 5 atms % hydrogen is contained in a crystallized silicon film 204. During the above heat treatment, nickel accelerates the crystallization of the silicon film 204 while it is moving in the silicon film.

Figure 2B:
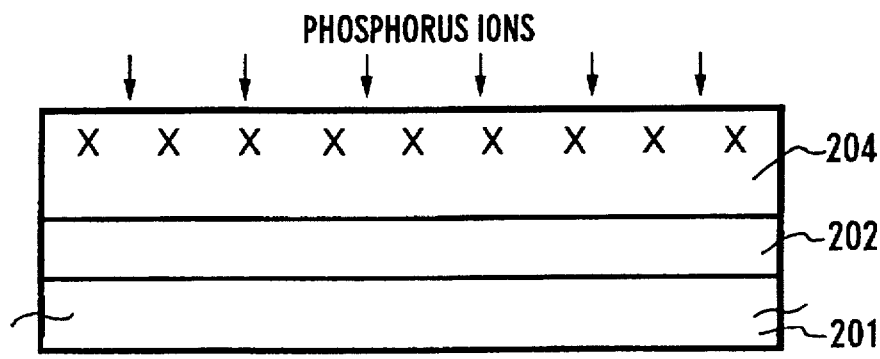

In this way, the crystalline silicon film 204 can be formed on the glass substrate. In this state, the implantation of phosphorus (P) ions is conducted by a plasma doping method. The dose amount may be set to $1\times10^{14}$ to $1\times10^{17}/cm^2$, and in this embodiment, it is set to $1\times10^{16}/cm^2$. The accelerating voltage is set to 20 keV. Through this process, a layer containing phosphorus at a high concentration is formed within a region of 0.1 to 0.2 µm depthwise from the surface of the crystalline silicon film 204. Thereafter, a heat treatment is conducted on the crystalline silicon film 204 in order to getter nickel remaining in the crystalline silicon film 204. The crystalline silicon film 204 may be subjected to a heat treatment at 500° to 800° C., preferably 550° C. for 1 to 4 hours in a nitrogen atmosphere (FIG. 2B).

In the crystalline silicon film 204, since the region into which phosphorus ions have been implanted has its crystallinity destroyed, it becomes of a substantially amorphous structure immediately after the ions have been implanted thereinto. Thereafter, since that region is crystallized through said heat treatment, it is usable as the n-type layer of the solar cell even in this state. In this case, the concentration of nickel in the i-type or p-type layer 204 is lower than in the phosphorus doped n-type layer.

Figure 2C:
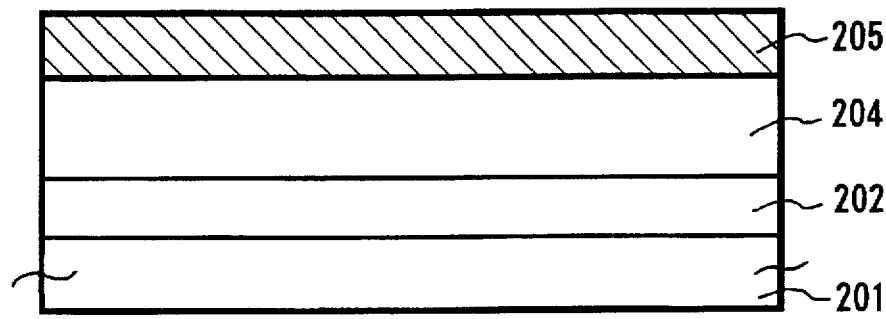

In accordance with a preferred embodiment of the invention, the phosphorus implanted region is more desirably removed since nickel that has functioned as a catalyst element is segregated in this region. As the removing method, after a thin natural oxide film on the surface has been etched using an aqueous hydrogen fluoride aqueous solution, it is removed via dry etching using sulfur hexafluoride and nitric trifluoride. With this process, the surface of the crystalline silicon film 204 is exposed. An n-type crystalline silicon film 205 is formed on that surface. The n-type crystalline silicon film 205 may be formed by plasma CVD or low pressure thermal CVD. The n-type crystalline silicon film 205 is desirably formed at a thickness of 0.02 to 0.2 μm, and in this embodiment, it is formed at a thickness of 0.1 μm (FIG. 2C).

Figure 2D:
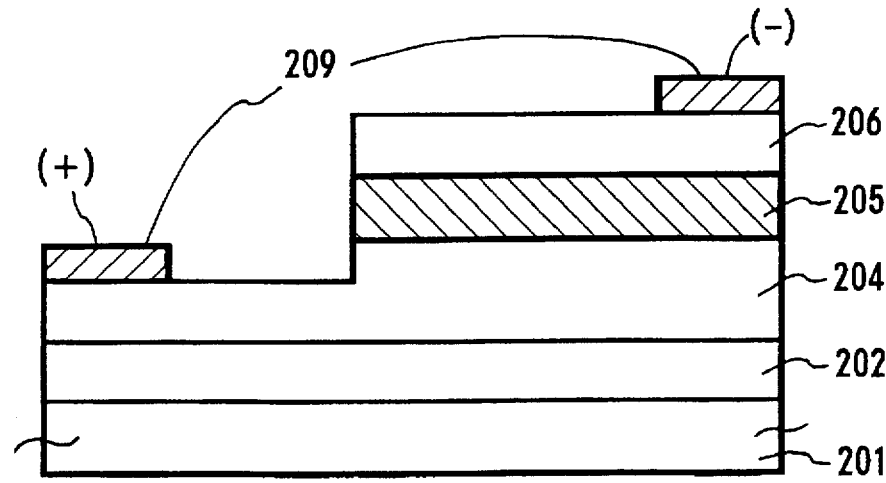

Then, a transparent electrode 206 is formed via a sputtering technique on the above n-type crystalline silicon film 205. The transparent electrode 206 is made of indium tin oxide alloy (ITO) and has a thickness of 0.08 μm. Finally, a process of providing output lead electrodes 207 is conducted. In providing the output electrodes 207, as shown in FIG. 2D, a negative side electrode is disposed on the transparent electrode 206, and a positive side electrode is disposed on the crystalline silicon film 204 by removing parts of the transparent electrode 206, the n-type crystalline silicon film 205, and the crystalline silicon film 204. The output electrodes 207 can be formed through a sputtering technique or an evaporation method, or by using aluminum or silver paste or the like. Furthermore, after the provision of the output lead electrodes 207, the substrate is subjected to a heat treatment at 150° C. to 300° C. for several minutes with the result that the adhesion between the output electrodes 207 and the underlying layer becomes high, thereby obtaining excellent electric characteristics. In this embodiment, the substrate is subjected to a heat treatment at 200° C. for 30 minutes in a nitrogen atmosphere using an oven.

Through the above-mentioned processes, a thin-film solar cell is completed.

Third Embodiment

Figure 3:
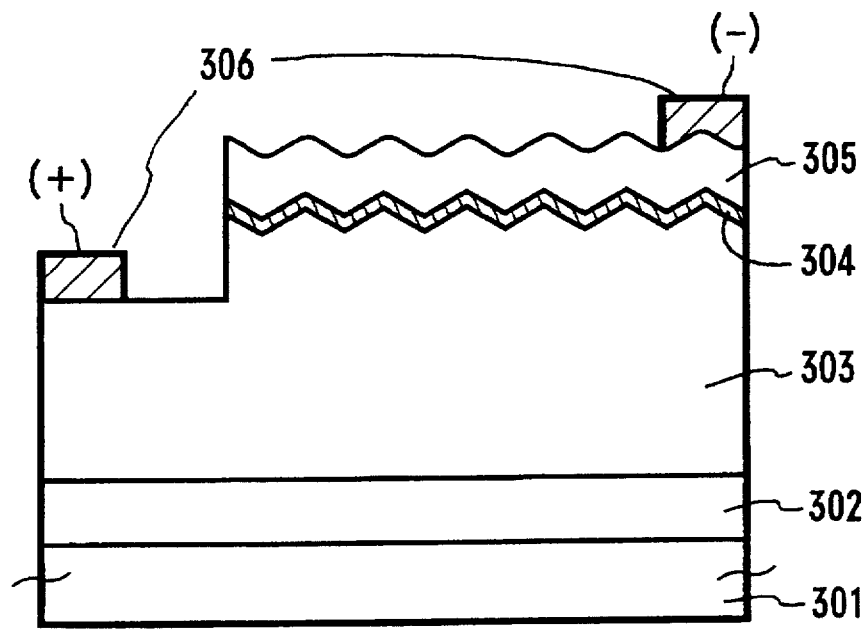
FIG. 3 is a diagram showing an example of a cross-sectional structure of a thin-film solar cell in accordance with the present invention.

A third embodiment shows an example where in the process of manufacturing the thin-film solar cell described with reference to the first and second embodiments, the surface of the crystalline silicon film is subjected to an anisotropic etching process so as to make the surface of the solar cell irregular as shown in FIG. 3. A technique by which that surface is made irregular so that reflection from the surface of the solar cell is reduced is called a "texture technique".

A silicon oxide film 302 having a thickness of 0.3 μm is formed on a glass substrate (for example, Corning 7059 glass substrate) 301 as an underlying layer. The silicon oxide film 302 is formed by plasma CVD with tetra ethoxy silane (TEOS as a raw material), and also can be formed by sputtering as another method. Subsequently, an amorphous silicon film is formed by plasma CVD. The formation of the amorphous silicon film may be conducted by low pressure thermal CVD, sputtering, evaporation, or the like. The above amorphous silicon film 303 may be a substantially-intrinsic amorphous silicon film or an amorphous silicon film to which of 0.001 to 0.1 atms % boron (B) has been added. Also, the thickness of the amorphous silicon film is set at 20 μm. However, the thickness may be set at any required value.

Subsequently, the substrate is immersed in an ammonium hydroxide and hydrogen peroxide mixture and then held at 70° C. for 5 minutes, to thereby form an oxide film on the surface of the amorphous silicon film. The silicon oxide film is formed in order to improve wettability in the next step of coating nickel acetate solution. The nickel acetate solution is coated on the surface of the amorphous silicon film by spin coating. The nickel functions as an element that accelerates the crystallization of the amorphous silicon film.

Subsequently, the amorphous silicon film is held at a temperature of 450° C. for one hour in a nitrogen atmosphere, thereby eliminating hydrogen from the amorphous silicon film. This is because dangling bonds are intentionally produced in the amorphous silicon film, to thereby lower the threshold energy in subsequent crystallizing. Then, the amorphous silicon film is subjected to a heat treatment at 550° C. for 4 to 8 hours in a nitrogen atmosphere, to thereby crystallize the amorphous silicon film to obtain a crystalline silicon film 303. The temperature during crystallizing can be set to 550° C. because of the action of nickel. 0.001 atms % to 5 atms % of hydrogen is contained in the crystalline silicon film 303. During the above heat treatment, nickel accelerates the crystallization of the silicon film 303 while it is moving in the silicon film.

In this way, the crystalline silicon film 303 can be formed on the glass substrate. Then, a gettering process is conducted on the crystalline silicon film 304 in order to remove nickel remaining in the crystalline silicon film 304. A method of conducting the gettering process may include forming a phospho-silicate glass (PSG) on the crystalline silicon film 303, or implanting phosphorus ions into the surface of the crystalline silicon film 303.

In the method comprising of forming the phospho-silicate glass (PSG), the phospho-silicate glass film is formed via atomspheric CVD, using a gas mixture consisting of silane, phosphine, and oxygen, at a temperature of 450° C. The gettering process is then conducted by subjecting the crystalline silicon film to a heat treatment at 550° C. for 1 to 4 hours in a nitrogen atmosphere. Thereafter, the phospho-silicate glass film is desirably etched using an aqueous hydrogen fluoride aqueous solution so as to be removed.

In the method comprising implanting phosphorus ions into the surface of the crystalline silicon film, the implantation of ions can be conducted through plasma doping. The dose amount may be set to $1 \times 10^{14}$ to $1 \times 10^{17}/cm^2$, and in this embodiment, it is set to $1 \times 10^{16}/cm^2$. The accelerating voltage is set to 20 keV. Through this process, a layer containing phosphorus at a high concentration is formed within a region of 0.1 to 0.2 μm depthwise from the surface of the crystalline silicon film. Thereafter, a heat treatment is conducted on the crystalline silicon film in order to getter nickel remaining in the crystalline silicon film. The heat treatment is conducted at a temperature of 500° to 800° C., preferably 550° C. for 1 to 4 hours in a nitrogen atmosphere.

After the gettering process has been completed, a texture process is conducted on the surface of the crystalline silicon film. The texture process can be conducted using hydrazine or sodium hydroxide aqueous solution. Hereinafter, a case of using sodium hydroxide will be described.

The texture process is conducted by heating a 2% aqueous solution of sodium hydroxide to 80° C. Under this condition, the etching rate of the crystalline silicon film thus obtained in this embodiment is about 1 μm/min. The etching is conducted for five minutes, and thereafter the crystalline silicon film is immersed in boiling water in order to immediately cease the reaction and then the film is sufficiently cleaned by flowing water. As a result of observing the surface of the crystalline silicon film which has been subjected to the texture process through an electron microscope, an unevenness of about 0.1 to 5 μm is found on the surface although it is at random.

An n-type crystalline silicon film 304 is formed on that surface. The n-type crystalline silicon film 304 may be formed through a plasma CVD technique or through a low pressure thermal CVD technique. The n-type crystalline silicon film 304 is desirably formed at a thickness of 0.02 to 0.2 μm, and in this embodiment, it is formed at a thickness of 0.1 μm.

Then, a transparent electrode 305 is formed by sputtering on the above n-type crystalline silicon film 304. The transparent electrode 305 is made of indium tin oxide alloy (ITO) and has a thickness of 0.08 μm. Finally, a process of providing output electrodes 307 is conducted. In providing the output electrodes 307, as shown by the structure in FIG. 3D, a negative side electrode is disposed on the transparent electrode 305, and a positive side electrode is disposed on the crystalline silicon film 303 by removing parts of the transparent electrode 305, the n-type crystalline silicon film 304, and the crystalline silicon film 303. The output electrodes 306 can be formed by sputtering or vacuum evaporation, or using an aluminum or silver paste or the like. Furthermore, after the provision of the output lead electrodes 307, the entire structure is subjected to a heat treatment at 150° C. to 300° C. for several minutes with the result that the adhesion between the lead electrodes 207 and the underlying layers becomes high, thereby obtaining excellent electric characteristics. In this embodiment, the heat treatment was conducted at 200° C. for 30 minutes in a nitrogen atmosphere using an oven.

Through the above-mentioned processes, a thin-film solar cell having the texture structure on the surface is completed.

Fourth Embodiment

Figure 4:
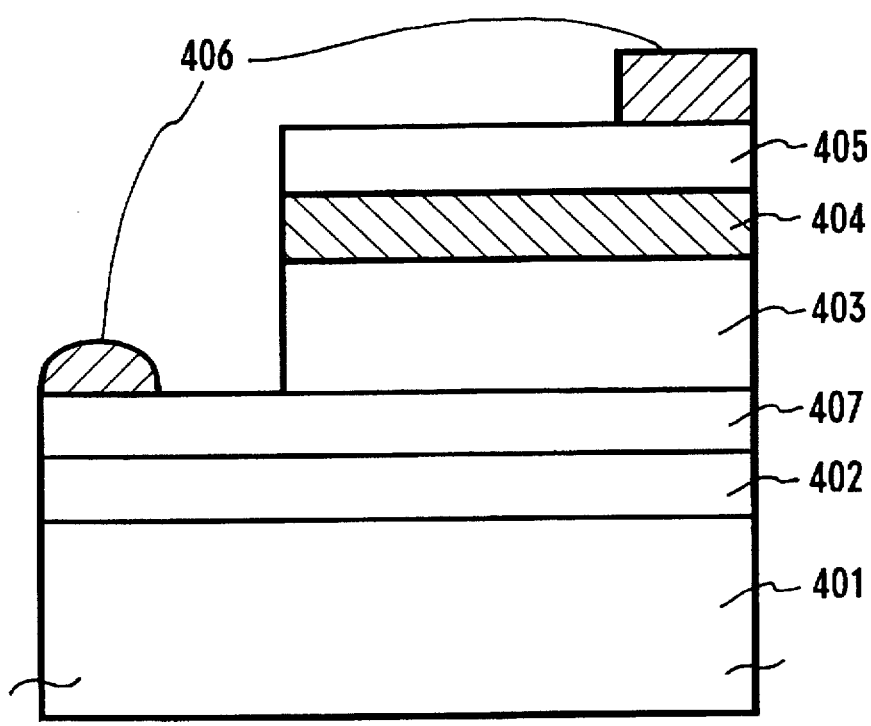
FIG. 4 is a diagram showing an example of a cross-sectional structure of a thin-film solar cell in accordance with the present invention.

A fourth embodiment is a process of manufacturing a thin-film solar cell, as shown in FIG. 4, in which a coating of a metal element that accelerates the crystallization of silicon is formed on a substrate, an amorphous silicon film is formed on the coating of metal element, the amorphous silicon film is crystallized through a heat treatment, and after crystallization, the metal element diffused in the silicon film is removed therefrom.

First, a coating of the metal element that accelerates the crystallization of silicon is formed on a substrate. Nickel is used as the metal element. A silicon oxide film having a thickness of 0.3 μm is first formed on a glass substrate (for example, Corning 7059 glass substrate) 401 as an underlying layer 402. The silicon oxide film is formed through a plasma CVD technique with of tetra ethoxy silane (TEOS) as a raw material, and also can be formed through a sputtering technique as another method. Subsequently, a nickel film 407 is formed on the substrate. The nickel film 407 having 0.1 μm is formed through an electron beam evaporation method using a tablet made of pure nickel. Then, an amorphous silicon film is formed through a plasma CVD technique. The formation of the amorphous silicon film may be conducted through low pressure thermal CVD, sputtering, evaporation, or the like. The above amorphous silicon film may be a substantially-intrinsic amorphous silicon film or an amorphous silicon film to which 0.001 to 0.1 atms % boron (B) has been added. Also, the thickness of the amorphous silicon film is set at 10 μm. However, the thickness may be set at any required value.

Subsequently, the amorphous silicon film is held at a temperature of 450° C. for one hour in a nitrogen atmosphere, thereby eliminating hydrogen from the amorphous silicon film. This is because dangling bonds are intentionally produced in the amorphous silicon film, to thereby lower the threshold energy in subsequent crystallizing. Then, the amorphous silicon film is subjected to a heat treatment at 550° C. for 4 to 8 hours in a nitrogen atmosphere, to thereby crystallize the amorphous silicon film to obtain a crystalline silicon film 403. The temperature during crystallizing can be set to 550° C. because of the action of the nickel. 0.001 atms % hydrogen to 5 atms % is contained in a the crystalline silicon film 403. During the above heat treatment, a small amount of nickel diffuses into the silicon film from the nickel film disposed under the amorphous silicon film, and accelerates the crystallization of the crystalline silicon film 403 while it is moving in the silicon film.

In this way, the crystalline silicon film 403 is formed on the glass substrate. Subsequently, a phospho-silicate glass (PSG) is formed on the crystalline silicon film 403. The phospho-silicate glass (PSG) is formed by atmospheric CVD gas, using a mixture consisting of silane, phosphine, and oxygen, at a temperature of 450° C. The concentration of phosphorus in the phospho-silicate glass is set to 1 to 30 wt %, preferably 7 wt %. The phospho-silicate glass is used to getter nickel remaining in the crystalline silicon film. Even though the phospho-silicate glass is formed at only 450° C., its effect is obtained. More effectively, the phospho-silicate glass may be subjected to a heat treatment at a temperature of 500° to 800° C., preferably 550° C. for 1 to 4 hours in the nitrogen atmosphere. As another method, the phospho-silicate glass can be replaced with the same effect by a silicon film to which 0.1 to 10 wt % phosphorus has been added with the same effect.

Thereafter, the phospho-silicate glass is etched using an aqueous hydrogen fluoride solution so as to be removed from the surface of the crystalline silicon film. As a result, the surface of the crystalline silicon film 403 is exposed. An n-type crystalline silicon film 404 is formed on that surface. The n-type crystalline silicon film 404 may be formed by plasma CVD or low pressure thermal CVD. The n-type crystalline silicon film 404 is desirably formed at a thickness of 0.02 to 0.2 μm, and in this embodiment, it is formed at a thickness of 0.1 μm.

Then, a transparent electrode 405 is formed by sputtering on the above n-type crystalline silicon film 404. The transparent electrode 405 is made of indium tin oxide alloy (ITO) and has a thickness of 0.08 μm. Finally, a process of providing output electrodes 406 is conducted. In providing the output electrodes, as shown in FIG. 4, a negative side electrode is disposed on the transparent electrode 405, and a positive side electrode is disposed on the crystalline silicon film 403 by removing parts of the transparent electrode 405, the n-type crystalline silicon film 404 and the crystalline silicon film 403. The output electrodes 406 can be formed by sputtering or vacuum evaporation, or by using aluminum or silver paste or the like. Furthermore, after the provision of the output electrodes, the substrate is subjected to a heat treatment at 150° C. to 300° C., for example at 200° C. for 30 minutes in a nitrogen atmosphere, with the result that the adhesion between the output electrodes and the underlying layer becomes high, thereby obtaining excellent electric characteristics.

Through the above-mentioned processes, a thin-film solar cell is completed.

As was described above, in the method of manufacturing the thin-film solar cell in accordance with the present invention, in a process of crystallizing an amorphous silicon film by a heat treatment, a catalyst material such as nickel is used, thereby making it possible to obtain a crystalline silicon film at a heat treatment temperature lower than in the conventional methods. Furthermore, the method of the present invention enables the concentration of the catalyst material remaining in the crystalline silicon film obtained to be lowered. As a result, a thin-film solar cell that uses an inexpensive glass substrate and is excellent in photoelectric conversion characteristic can be obtained.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a photoelectric conversion device, comprising the steps of:
    disposing a metal containing layer in contact with an upper or lower surface of a non-single crystalline silicon semiconductor layer;
    crystallizing said non-single crystalline silicon semiconductor layer by heating, wherein said metal functions to promote the crystallization;
    forming a gettering layer on or a gettering region within said semiconductor layer after said crystallizing, said gettering layer containing phosphorus; and
    heating said semiconductor layer and said gettering layer or region in order to getter said metal contained in said semiconductor layer.

2. The method of claim 1 wherein said metal is selected from the group consisting of Ni, Fe, Co, Ru, Rh, Pd, Os, Ir, Pt, Cu, and Au.

3. The method of claim 1 wherein said photoelectric conversion device is a solar cell.

4. A method of manufacturing a photoelectric conversion device, comprising:
    disposing a metal containing layer in contact with a non-single crystalline silicon semiconductor layer, said metal being a catalyst that promotes crystallization of said silicon semiconductor layer;
    crystallizing said silicon semiconductor layer by a heating treatment wherein said metal functions to promote said crystallization;
    forming a phosphorus doped silicon gettering layer on said semiconductor layer after said crystallizing; and
    heating said phosphorus doped silicon layer and said semiconductor layer to activate said phosphorus for gettering said catalyst metal contained in said crystallized semiconductor layer.

5. The method of claim 4 wherein said non-single crystalline silicon semiconductor layer is formed on a substrate having an electrode thereon and said metal containing layer is formed on an upper surface of said semiconductor layer.

6. The method of claim 4 wherein said phosphorus doped silicon layer contains phosphorus in a concentration of 0.1 to 10 wt %.

7. The method of claim 4 further comprising a step of etching the surface of said crystallized semiconductor layer after the step of heating said phosphorus doped silicon layer and said semiconductor layer in order to make the surface of said crystallized semiconductor layer uneven.

8. The method of claim 4 wherein said photoelectric conversion device is a solar cell.

9. A method of manufacturing a photoelectric conversion device, comprising:
    disposing a metal containing layer in contact with a non-single crystalline silicon semiconductor layer, said metal being a catalyst that promotes crystallization of said silicon semiconductor layer;
    crystallizing said semiconductor layer by a heating treatment wherein said metal functions to promote said crystallization thereof;
    introducing phosphorus ions into a surface of said semiconductor layer after said crystallizing; and
    subsequentially heating said semiconductor layer to activate said phosphorus ions for gettering said catalyst metal contained in said crystallized semiconductor layer.

10. The method of claim 9 wherein said non-single crystalline silicon semiconductor layer is formed on a substrate having an electrode thereon and said metal containing layer is formed on an upper surface of said semiconductor layer.

11. The method of claim 9 further comprising a step of etching the surface of said crystallized semiconductor layer after the step of heating said semiconductor layer in order to make the surface of said crystillized semiconductor layer uneven.

12. The method of claim 9 wherein said photoelectric conversion device is a solar cell.

13. A method of manufacturing a photoelectric conversion device, comprising:
    disposing a metal containing layer in contact with a non-single crystalline silicon semiconductor layer, said metal being a catalyst that promotes crystallization of said silicon semiconductor layer;
    crystallizing said semiconductor layer by a heating treatment wherein said metal functions to promote said crystallization
    forming a phospho-silicate glass layer on said semiconductor layer after said crystallizing; and
    heating said phosphorus silicate glass layer and said semiconductor layer to activate phosphorus ions in said phospho-silicate glass layer for gettering said catalyst metal contained in said crystallized semiconductor layer.

14. The method of claim 13 wherein said non-single crystalline silicon semiconductor layer is formed on a substrate having an electrode thereon and said metal containing layer is formed on an upper surface of said semiconductor layer.

15. The method of claim 13 wherein said phospho-silicate glass layer contains phosphorus at a concentration of 1 to 30 wt %.

16. The method of claim 13 further comprising a step of etching the surface of said crystallized semiconductor layer after the step of heating said phospho-silicate glass layer and said crystallized semiconductor layer in order to make the surface of said crystallized semiconductor layer uneven.

17. The method of claim 13 wherein said photoelectric conversion device is a solar cell.

18. A method of manufacturing a photoelectric conversion device, comprising:
    forming a metal layer on a substrate, said metal being a catalyst to promote crystallization of silicon;
    depositing a non-single crystalline silicon semiconductor layer on said metal layer;
    crystallizing said semiconductor layer by a heating process wherein said metal functions to promote crystallization of said semiconductor layer;
    forming a phosphorus containing layer or region on or within said semiconductor layer after said crystallizing; and
    heating said phosphorus containing layer or region and said crystallized semiconductor layer so that said phosphorus is activated to getter said metal.

19. The method of claim 18 further comprising a step of etching the surface of said crystallized semiconductor layer after the step of heating said phosphorus containing layer and said crystallized semiconductor layer in order to make the surface of said crystallized semiconductor layer uneven.

20. The method of claim 18 wherein said photoelectric conversion device is solar cell.

21. A solar cell comprising:
   a substrate;
   a first crystalline silicon film of a first conductivity type on said substrate, having a metal catalyst element for promoting crystallization of silicon at a concentration not higher than $5 \times 10^{18}$ atoms/cm$^3$; and
   a second crystalline silicon film a second conductivity type that is different from said first conductivity type, said second crystalline silicon film being adjacent to said first crystalline silicon film.

22. The solar cell of claim 21 wherein said metal catalyst element is selected from the group consisting of Ni, Fe, Co, Ru, Rh, Pd, Os, Ir, Pt, Cu, and Au.

23. The solar cell of claim 21 wherein the concentration of said catalyst element contained in said second crystalline silicon film is higher than said the concentration of said metal catalyst contained in said first crystalline silicon film.

24. The solar cell of claim 21 wherein said first crystalline silicon film comprises a plurality of crystal grains in the form of needles.

25. A method of manufacturing a semiconductor device, comprising:
   disposing a catalyst material in contact with a surface of a non-single crystalline silicon semiconductor layer, said catalyst material including a metal;
   crystallizing said non-single crystalline silicon semiconductor layer, wherein said metal operates to promote said crystallization;
   forming a gettering layer or region comprising phosphorus on or within said semiconductor layer after said crystallization; and
   heating said semiconductor layer and said gettering layer or region to getter said metal contained in said crystallized semiconductor layer.

26. A method according to claim 25, wherein said crystallizing of said non-single crystalline silicon semiconductor layer is carried out by a heating treatment.

27. A method according to claim 25, wherein said metal is selected from a group consisting of Ni, Fe, Co, Ru, Rh, Pd, Os, Ir, Pt, Cu, and Au.

28. A method of manufacturing a semiconductor device, comprising:
   disposing a catalyst material comprising a metal in contact with a non-single crystalline silicon semiconductor layer;
   crystallizing said semiconductor layer, wherein said metal operates to promote said crystallization;
   introducing phosphorus ions into a portion of said semiconductor layer after said crystallizing; and
   subsequentially heating said crystallized semiconductor layer so that said metal is gettered by said phosphorus ions.

29. A method according to claim 28, wherein said crystallizing of said non-single crystalline silicon semiconductor layer is carried out by a heating process.

30. A method according to claim 28, wherein said metal is selected from a group consisting of Ni, Fe, Co, Ru, Rh, Pd, Os, Ir, Pt, Cu, and Au.

31. A method according to claim 28, further comprising a step of removing said portion of said crystallized semiconductor layer by an etching process after said heating of said semiconductor layer.

* * * * *